United States Patent [19]
Gardner

[11] Patent Number: 5,719,447
[45] Date of Patent: Feb. 17, 1998

[54] METAL ALLOY INTERCONNECTIONS FOR INTEGRATED CIRCUITS

[75] Inventor: Donald S. Gardner, Mountain View, Calif.

[73] Assignee: Intel Corporation, Santa Clara, Calif.

[21] Appl. No.: 454,005

[22] Filed: May 30, 1995

Related U.S. Application Data

[63] Continuation of Ser. No. 71,451, Jun. 3, 1993, abandoned.

[51] Int. Cl.$^6$ .................................................. H01L 23/48
[52] U.S. Cl. ........................... 257/762; 257/751; 257/761; 437/179
[58] Field of Search .................................... 257/762, 742, 257/751, 761; 437/179

[56] References Cited

U.S. PATENT DOCUMENTS

| | | | |
|---|---|---|---|
| 4,027,326 | 5/1977 | Kummer et al. | 257/762 |
| 4,198,248 | 4/1980 | Mandigo et al. | 148/2 |
| 4,666,667 | 5/1987 | Kamio et al. | 420/471 |
| 4,872,048 | 10/1989 | Akutsu et al. | 257/762 |
| 4,985,750 | 1/1991 | Hoshino | 257/762 |
| 5,060,050 | 10/1991 | Tsuneoka et al. | 257/762 |
| 5,177,588 | 1/1993 | Li et al. | 257/640 |
| 5,306,465 | 4/1994 | Caron et al. | 420/492 |
| 5,365,110 | 11/1994 | Matsuoka | 257/762 |

FOREIGN PATENT DOCUMENTS

| | | | |
|---|---|---|---|
| 0235749 | 9/1987 | Japan | 257/762 |
| 5-47760 | 2/1993 | Japan | 257/762 |

OTHER PUBLICATIONS

Full English translation of Japan Kokai 5–47760 as per USPTO.

"Utilization of Copper Transition Alloys in Integrated Circuits", *IJSM Technical Disclosure Bulletin* vol. 35, No. 7 (Dec. 1992) pp. 133–134.

Rossiter, Paul L., *The electrical resistivity of metals and alloys*, Cambridge University Press, Cambridge (pp. 220–223).

Massalski, Thaddeus B., *Binary Alloy Phase Diagrams: vol. 1*, American Society for Metals, 1986, (pp. 936–976).

D'Heurle, et al., *Electrotransport in Copper Alloy Films and the Defect Mechanism in Grain Boundary Diffusion*, Thin Solid films, 25 (1975) pp. 531–544.

Mehl, et al., *Constitution of Binary Alloys*, McGraw–Hill Book Co., Inc., Armour Research Foundation, Illinois (1958) pp. 8–15, 18–23, 34, 35, 50–55, 58, 59, 62, 63, 600–601, 376–379, 384–389, 602–607, 638–639, 642–649.

*Primary Examiner*—J. Carroll
*Attorney, Agent, or Firm*—Blakely, Sokoloff, Taylor & Zafman

[57] ABSTRACT

Novel metal-alloy interconnections for integrated circuits. The metal-alloy interconnections of the present invention comprise a substantial portion of either copper or silver alloyed with a small amount of an additive having a low residual resistivity and solid solubility in either silver or copper such that the resultant electrical resistivity is less than 3 μΩ-cm.

11 Claims, 2 Drawing Sheets

METAL ALLOY INTERCONNECTIONS FOR INTEGRATED CIRCUITS

This is a continuation of application Ser. No. 08/071,451, filed Jun. 3, 1993 now abandoned.

BACKGROUND OF THE INVENTION

1. Field of the Invention

The present invention relates to the field of integrated circuit manufacturing, and more specifically, to interconnection metals for integrated circuits.

2. Description of Relevant Art

Modern integrated circuits are made up of literally millions of active devices such as transistors and capacitors formed in a semiconductor substrate. These devices are initially isolated from one another but are later interconnected together to form functional circuits. The quality of the interconnection metal drastically effects the performance and reliability of the fabricated integrated circuit. Interconnection metals are increasingly determining the limits in performance, density and reliability of modern ultra large scale (ULSI) circuits.

FIG. 1 is a cross-sectional illustration of an interconnect structure which is presently widely used in the semiconductor industry. It comprises a silicon substrate 101 in which active devices (not shown) are formed. An interlayer dielectric (ILD) 103 is formed over the substrate to isolate aluminum interconnection lines 105 and 107 from active devices formed below. The aluminum interconnection lines interconnect various devices to form functional circuits. The aluminum interconnection lines are typically coupled to the substrate by metal plugs 109 and 111.

Aluminum and its alloys have been widely used as interconnection lines 105 and 107 in interconnect structures because they have good resistivity (~3.0 $\mu\Omega$-cm) and they have good adhesion to $SiO_2$, which is typically used as an ILD. Additionally, aluminum doped with a small amount of copper does not diffuse through ILD 103 and interact with the substrate below. Unfortunately, aluminum offers poor resistance to electromigration which increases the potential for open circuits from voids or short circuits from hillocks. Additionally, aluminum thin films suffer from stress migration which can cause voids and hillocks at relatively low temperatures. Hillocks can cause interlevel and intralevel shorts in multilevel integrated circuits. Still another problem with aluminum alloy lines is that they are susceptible to humidity-induced corrosion.

In an attempt to improve the performance, reliability, and density of interconnections, alternative interconnection metals to aluminum and aluminum alloys have been proposed. Pure copper has been proposed as a substitute for aluminum metalization. Pure copper has an extremely low resistivity (~1.7 $\mu\Omega$-cm). A low resistivity interconnection metal improves performance of an integrated circuit by increasing its speed. Additionally, pure copper is resistant to electromigration which makes it a much more reliable interconnection metal than aluminum and aluminum alloys.

Unfortunately, pure copper interconnections have several shortcomings which make them ill-suited for use in high performance reliable integrated circuits. First, pure copper readily oxidizes whenever oxygen is present. Oxidation of copper interconnections increases the electrical resistivity of the interconnection, thereby decreasing the performance of the fabricated circuit. It is to be appreciated that interconnections can be exposed to oxygen during a number of steps in the integrated circuit manufacturing process. For example, interconnections are exposed to oxygen in air whenever wafers sit idle between process modules. Interconnections can also be exposed to oxygen during the formation of oxide based ($SiO_2$) interlayer dielectrics. Oxidation of copper is especially troublesome because the reaction between copper and oxygen is not self limiting, unlike other metals such as aluminum, and therefore the entire interconnection can become oxidized which drastically increases the resistance of the interconnection. Another problem with pure copper interconnections is that they easily corrode (in addition to oxidizing, a form of corrosion) and cause reliability problems. Still another problem with copper interconnections is that they readily diffuse through $SiO_2$ and other ILD materials such as polyimides. Pure copper interconnections, therefore, require a barrier layer to prevent diffusion. Barrier layers add expense and process complexity to the fabrication of an integrated circuit.

In a similar manner, pure silver has been proposed as a substitute for aluminum alloy interconnections. Silver has an extremely low resistivity (~1.61 $\mu\Omega$-cm). Unfortunately, however, like pure copper, pure silver readily oxidizes and corrodes creating reliability problems.

Thus, what is desired is an interconnection metal which has a low resistivity but at the same time is resistant to void and hillock formation, oxidation, and corrosion.

SUMMARY OF THE INVENTION

Novel, high reliability, high performance copper-alloy interconnections for integrated circuits are described. The copper-alloy interconnections of the present invention comprises copper and less than five atomic percent of an additive having a low residual resistivity and solid solubility in copper. The preferred composition of the copper-alloy interconnections of the present invention comprises substantially all copper and between 0.01–1.0 atomic percent of either palladium, niobium or vanadium. The copper-alloy interconnections can be formed by sputtering with a single copper-alloy target having the desired copper-alloy composition. The copper-alloy interconnections can be patterned from a copper-alloy layer with reactive ion etching with a chlorine chemistry. The copper-alloy interconnections can also be patterned by chemical-mechanical polishing.

A goal of the present invention is to provide a high performance, high reliability interconnection for an integrated circuit.

Another goal of the present invention is to provide an interconnection which is not susceptible to electromigration caused hillock and void formation.

Still another goal of the present invention is to provide a copper-alloy interconnection which exhibits resistance to oxidation and corrosion.

Still yet another goal of the present invention is to provide a simple method of forming a uniform copper-alloy interconnect.

Still other objects and advantages of the present invention will become obvious from the detailed description which follows.

BRIEF DESCRIPTION OF THE DRAWINGS

FIG. 2b is an illustration of a cross-sectional view showing the formation of a barrier layer and a copper-alloy layer on the substrate of FIG. 2a.

DETAILED DESCRIPTION OF THE PRESENT INVENTION

Figure 1:
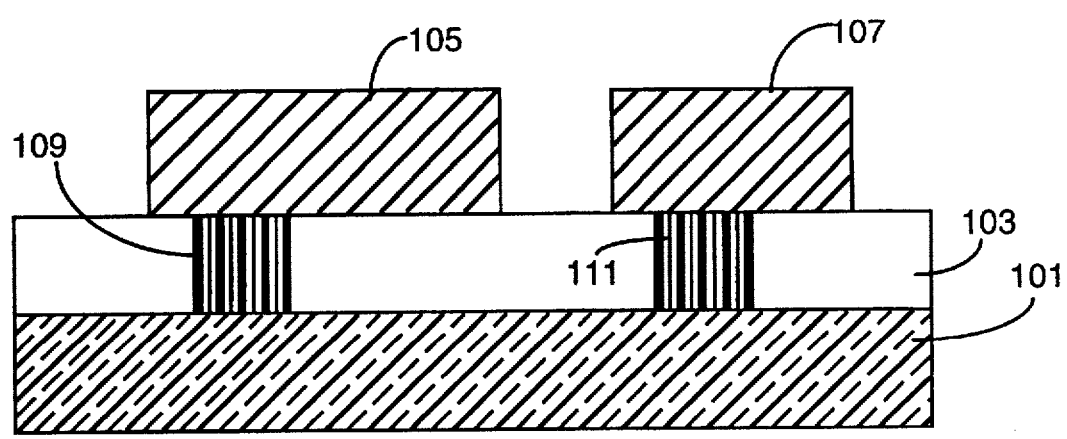
FIG. 1 is an illustration of a cross-sectional view showing a prior art interconnect structure.

The present invention describes novel, reliable, high performance metal-alloy interconnections and their method of fabrication. In the following description numerous specific details are set forth such as material types and thicknesses, etc., in order to provide a thorough understanding of the present invention. It will be obvious, however, to one skilled in the art that the present invention may be practiced without these specific details. In other instances, well-known semiconductor manufacturing processes and equipment have not been described in detail in order to not unnecessarily obscure the present invention.

The present invention describes novel metal-alloy interconnections for integrated circuits. The preferred embodiment of the present invention is a copper-alloy interconnection comprising pure copper alloyed with a small amount (less than five atomic percent) of an additive which has a low residual resistivity and solid solubility in copper. The preferred composition of the copper alloy interconnection of the present invention is pure copper alloyed with between 0.01–1.0 atomic percent of either vanadium (V), niobium (Nb), or palladium (Pd). The copper alloy interconnects of the present invention are resistant to oxidation, corrosion, and electromigration. Additionally, the copper alloy interconnects can have a low resistivity (less than 3 μΩ-cm) and are therefore ideal for use in modern, high performance integrated circuits. Additionally, the copper alloy interconnects are expected to be somewhat more resistant to diffusion through ILDs than pure copper interconnects.

Although niobium, vanadium, and palladium are preferred additives in the present invention, it is to be appreciated that other elements, compounds, or multiple element alloys may be used. The additive should be able to be alloyed with copper and improve copper's resistance to corrosion and oxidation without adversely effecting coppers low residual resistivity. The additive should itself have a low residual resistivity so that when alloyed with copper, the resultant alloy will have a low resistivity. Additionally, the additive should also have low solid solubility in copper in order to keep the resistivity of the copper-alloy low. It is to be appreciated that the resistivity of the copper alloy is dependent upon both the residual resistivity of the additive and the solid solubility of the additive in copper. Thus, in order to generate a low resistance conductor, the lower the residual resistivity of the additive, the higher is the acceptable level of solid solubility.

The percentage of the additive in the alloy varies depending upon the specific additive used. This is because the residual resistivity of elements in solid solution varies with additive and is partially dependent on the additives size relation to copper. The percentage of the additive in the alloy is kept small so that the additive can precipitate to the grain boundaries of the copper matrix. In this way the copper lattice is not distorted and its resistivity remains low. If large amounts of an additive are used, the additives can distort the lattice and decrease the electron mean free path which translates into a higher resistance conductor. Additionally, by keeping the percentage of additive in the copper-alloy low, the additives are able to diffuse to the surface of the interconnection and provide a protective layer against oxidation and corrosion. It is to be appreciated that the specific additive and its exact atomic percent used in the alloy can be chosen to optimize the desired electrical resistivity and corrosion resistance of the fabricated interconnection. The composition should be chosen to provide an interconnection with a resistivity lower than aluminum (~3 μΩ-cm) in order to generate a high performance interconnection.

Figure 2A:
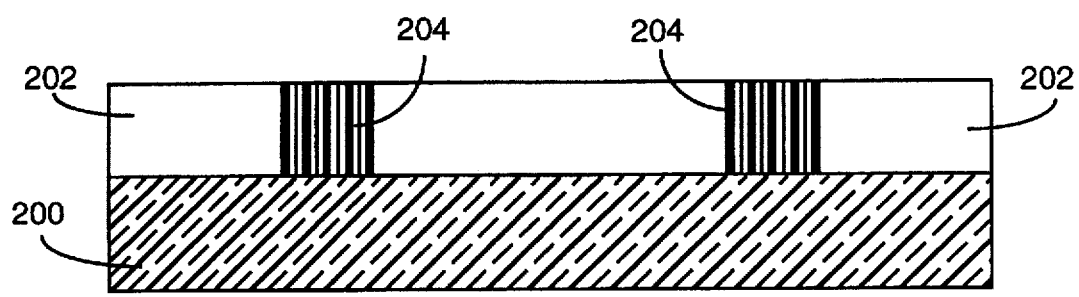
FIG. 2a is an illustration of a cross-sectional view showing the formation of an interlayer dielectric and metal plugs on a silicon substrate.

In fabrication of a copper-alloy interconnection of the present invention, a semiconductor substrate 200, such as silicon, in which active devices have been formed (not shown) is provided as shown in FIG. 2a. Formed on the substrate 200 is an interlayer dielectric (ILD) 202 such as $SiO_2$. ILD 202 is formed to a thickness of between 2,000–20,000 Å by techniques well-known in the art. Metal contacts or plugs 204 extend through ILD 200 to active devices formed in substrate 200.

Figure 2B:
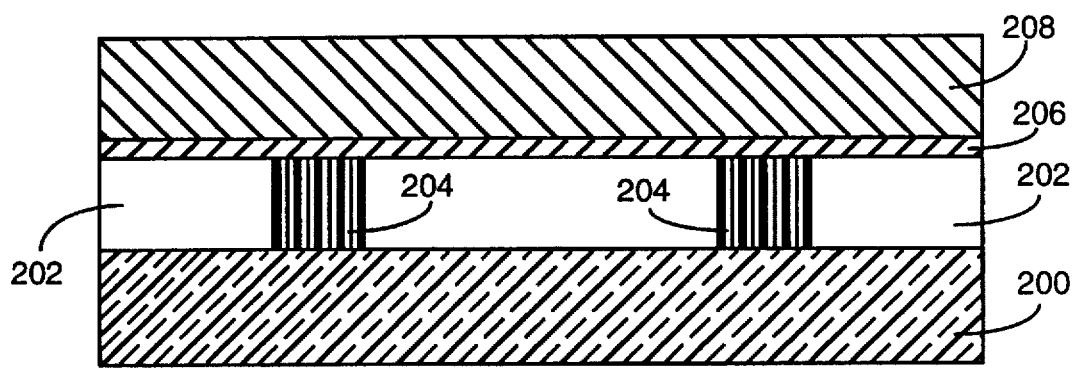

Next, as shown in FIG. 2b, a barrier layer 206 is formed on ILD 202 and on plugs 204. Barrier layer 206 prevents the subsequently formed copper-alloy layer from diffusing through ILD 202 and poisoning devices formed in substrate 200. It is to be appreciated that pure copper is know to readily diffuse through $SiO_2$ and other ILDs such as polyimides and parylene. Barrier layer 206 also improves adhesion of the subsequently formed copper-alloy layer to ILD 202. Barrier layer 206 can be any of a variety of materials including, but not limited to, conductors such as tantalum, tungsten, and titanium nitride, metal oxides, and dielectrics such as silicon nitride and silicon carbide. If a dielectric or metal-oxide is used, then it must be patterned when layer 202 is patterned to allow for the plugs 204 to contact the copper alloy layer 208. Barrier layer 206 is formed to a thickness of between 50–1000 Å and can be formed with any one of a number of well-known techniques including but not limited to chemical vapor deposition (CVD), sputtering, and evaporation.

Next, a copper-alloy layer 208 is deposited onto barrier layer 206. Copper-alloy layer 208 is deposited to a thickness of between 0.1–2.0μ, depending upon the level of metalization. In the preferred embodiment of the present invention, copper-alloy layer 208 is formed by sputtering with well-known techniques and equipment from a specially made copper-alloy target having the desired alloy composition. A copper-alloy target can be manufactured by metallurgists, such as Johnson-Matthey Inc., of Spokane, Washington, with techniques well-known by those skilled in the art. In general terms, a copper-alloy target can be manufactured by placing copper and the desired amount of an additive, such as niobium, vanadium, and palladium, or a combination thereof, in a crucible under vacuum at a temperature sufficiently high to melt and mix the copper and the additive together to form a homogeneous alloy. The molten copper-alloy can then be poured into a mold and machined into a standard target which can be used in well-known sputter deposition systems. A copper-alloy target having less than five atomic percent of an additive, with between 0.01–1.0 atomic percent additive preferred, is formed. The copper-alloy target can then used in a well-known sputtering apparatus, such as an Applied Materials Endura sputter machine, to form copper-alloy layer 208.

Although evaporation or sputtering from a single copper-alloy target is the preferred method of forming the copper-alloy layer 208, it is to be appreciated that other methods may be employed. For example, copper-alloy layer 208 can be formed by simultaneously sputtering or evaporating from a copper target and an additive target wherein the evaporation or sputtering from the copper target is at a higher rate than the sputtering from the additive target in order to form a copper-alloy layer with the desired composition. It is also conceivable that a chemical vapor deposition techniques could be used to form a copper-alloy with the desired composition. It is to be appreciated that sputtering or evaporating from a single copper-alloy target is preferred because the technique presently yields the most chemically uniform alloy layer. Additionally, sputtering from a single copper-alloy target to form as single copper-alloy layer is less complicated and less expensive that other techniques.

Figure 2C:
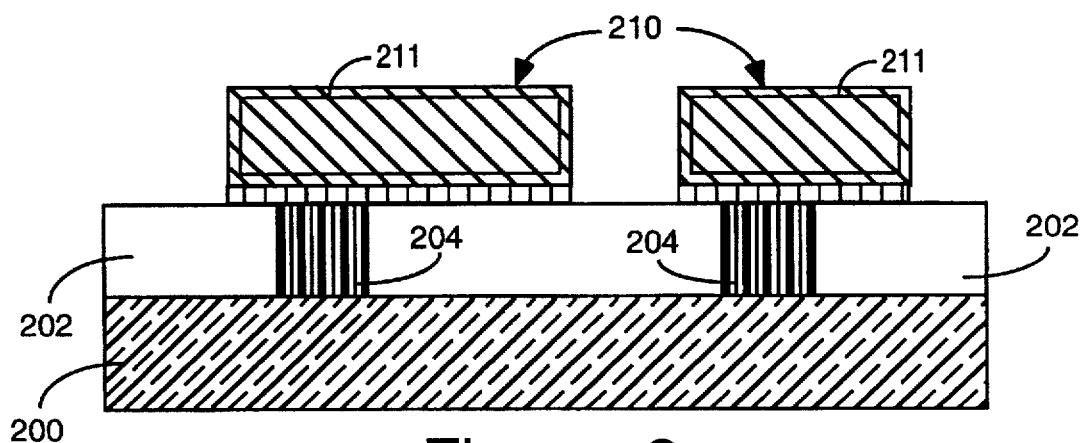
FIG. 2c is an illustration of a cross-sectional view showing the formation of individual interconnection lines from the copper-alloy layer and the barrier layer on the substrate of FIG. 2b.

Next, as shown in FIG. 2c, copper-alloy layer 208 and barrier layer 206 are patterned into individual interconnection lines 210. In a standard patterning process, a photoresist layer or masking layer is deposited onto copper-alloy layer 208 and patterned to define the location where interconnection lines will be formed. Next, the copper-alloy layer and the barrier layer are etched away wherever the masking layer has been removed. A reactive ion etch using a chemistry comprising chlorine and a noble gas can be used to pattern copper-alloy layer 208 and barrier layer 206. Although a dry anisotropic etch is preferred, a wet chemical etch can also be used.

After patterning copper-alloy layer 208 into individual interconnect lines 210, interconnect lines 210 are heat treated. Heat treating copper-alloy interconnections 210 diffuses some of the additives in the bulk of the alloy to the surface where they form a protective layer. In this way, copper in the interconnection is protected from oxidation and corrosion. Although not necessarily required, the heat treatment process is preferred in order to improve the corrosion and oxidation resistance of the copper-alloy interconnections. The protective layer is also expected to reduce copper's diffusion through ILDs such as $SiO_2$. In this way a barrier layer may not necessarily be required with the copper-alloy interconnections of the present invention. Heat treating of the interconnection lines can be accomplished by placing substrate 200 into a furnace at 200°–700° C. in a nitrogen or ammonia gas ambient for approximately 10–30 minutes. The heat treatment can be carried out "insitu" with the plasma etch step if desired. In this way the interconnection lines are not exposed to contaminants in air, prior to the heat treatment process. Rapid thermal processing can also be used if desired.

It is to be appreciated that other methods of patterning the copper-alloy layer into individual interconnections can be used. For example, well-known lift-off techniques can be used. Additionally, interconnect lines can be formed by depositing a copper-alloy into grooves in a previously patterned ILD and then chemically-mechanically polishing back to form individual interconnect lines.

Formation of the copper-alloy interconnect of the present invention is now complete. It is to be appreciated that additional process steps can now be used to complete the fabrication of a integrated circuit. For example, additional ILDs and copper interconnections can be formed to generate a multilevel integrated circuit. It is to be appreciated that although the present invention has been described with respect to an interconnection formed on the first level of metalization, the present invention is equally useful for higher levels of metalization (i.e. metal 2 and metal 3, etc.). Passivation layers may also be formed at this time to hermetically seal the completed integrated circuit from contamination.

Additionally, in a similar manner, it is believed that silver alloys comprising silver and a small amount of an additive such as palladium, vanadium, and niobium, can be used as interconnection metals. Silver has an extremely low resistivity (~1.6 μΩ-cm) making it an ideal high performance interconnection metal. Unfortunately, like copper, pure silver readily oxidizes and corrodes. It is believed, however, that silver alloyed with a small amount of additive (0.1–1.0 by atomic percent) will exhibit resistance to oxidation and corrosion in manner similar to copper alloys. A silver alloy layer can be formed by sputtering with a silver alloy target having the desired alloy composition. The silver alloy layer can then be patterned into individual interconnection lines with techniques well-known in the art for patterning pure silver.

Thus, novel, high performance, high reliability metal-alloy interconnections have been described.

I claim:

1. A metal alloy interconnection for an integrated circuit comprising:

silver; and an additive having a low residual resistivity and a low solid solubility in silver wherein said metal alloy interconnection comprises between 0.01–1.0 atomic percent of said additive.

2. The metal alloy interconnection of claim 1 wherein said additive is selected from the group consisting of niobium, palladium, and vanadium.

3. The metal alloy interconnection of claim 1 wherein said metal alloy comprises between 0.01–1.0 atomic percent niobium.

4. The metal alloy interconnection of claim 1 wherein said metal alloy comprises between 0.01–1.0 atomic percent palladium.

5. The metal alloy interconnection of claim 1 wherein said metal alloy comprises between 0.01–1.0 atomic percent vanadium.

6. A method of forming interconnection lines for an integrated circuit formed on a semiconductor substrate comprising the steps of:

forming an insulating layer above said substrate;

forming a silver-alloy layer above said insulating layer wherein said silver-alloy layer comprises:

silver; and an additive having a low residual resistivity and a low solid solubility in silver wherein said metal alloy layer comprises between 0.01–1.0 atomic percent of said additive; and patterning said silver-alloy layer into said interconnection lines.

7. The method of claim 6 wherein said additive is selected from the group consisting of niobium, palladium, and vanadium.

8. The method of claim 6 wherein said silver-alloy layer comprises between 0.01–1.0 atomic percent niobium.

9. The method of claim 6 wherein said silver-alloy layer comprises between 0.01–1.0 atomic percent palladium.

10. The method of claim 6 wherein said silver-alloy layer comprises 0.01–1.0 atomic percent vanadium.

11. The method of claim 6 wherein said silver-alloy layer is formed by sputtering from a target comprising silver and said additive.

* * * * *